(12) United States Patent
Locker et al.

(10) Patent No.: US 6,477,603 B1
(45) Date of Patent: Nov. 5, 2002

(54) MULTIPLE PCI ADAPTERS WITHIN SINGLE PCI SLOT ON AN MATAX PLANAR

(75) Inventors: Howard J. Locker, Cary; Daryl C. Cromer, Apex; Ernest N. Mandese, Durham; James Peter Ward, Raleigh; John K. Langgood, Cary; Joseph Pennisi, Apex; Jan M. Janick, Morrisville, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/358,106

(22) Filed: Jul. 21, 1999

(51) Int. Cl.$^7$ .......................... G06F 13/00; H01R 24/00; H05K 1/14
(52) U.S. Cl. .......................... 710/301; 361/785; 439/74
(58) Field of Search ................................. 710/301, 302, 710/104; 361/784, 683, 785, 756, 803, 686; 439/61, 74, 59, 377, 629, 638, 62, 541.5

(56) References Cited

U.S. PATENT DOCUMENTS

| 5,734,840 A | * | 3/1998 | Chew et al. |
| 6,046,912 A | * | 4/2000 | Leman |
| 6,137,678 A | * | 10/2000 | Gebara et al. |

* cited by examiner

*Primary Examiner*—Gopal C. Ray
(74) *Attorney, Agent, or Firm*—Sawyer Law Group L.L.P.

(57) ABSTRACT

Multiple PCI adapter cards are supported by a single PCI slot through the aspects of the present invention. A computer system aspect includes an $\mu$ATX planar including at least one PCI slot, and a riser card mounted in the at least one PCI slot, the riser card supporting multiple PCI adapter cards and providing signal generation to allow the multiple PCI adapter cards to utilize the at least one PCI slot. The riser card aspect includes a PCI connector for coupling to a PCI slot on the $\mu$ATX planar, a plurality of PCI slots for attaching a plurality of PCI adapter cards, and a logic device for providing separate bus signal pairs to each of the plurality of PCI adapter cards from a single signal pair of the PCI slot on the $\mu$ATX planar.

16 Claims, 2 Drawing Sheets

MULTIPLE PCI ADAPTERS WITHIN SINGLE PCI SLOT ON AN MATAX PLANAR

FIELD OF THE INVENTION

The present invention relates to computer system planars and more particularly to a riser card for increasing the number of PCI (peripheral component interconnect) adapter cards supported in a standard computer system planar.

BACKGROUND OF THE INVENTION

A standard computer system planar/motherboard is the μATX planar. Included on the μATX planar are expansion slots that allow peripheral component interconnect (PCI) adapter cards to be inserted in the computer system. The adapter cards are plugged into the planar at a right angle. The height of the adapter cards limits the ability to achieve a slim-line desktop with an μATX motherboard, because the lowest height is equal to the width of the adapter card plus the planar plus the mechanical. Generally, the lowest height is approximately over 5 inches, while the requirement for a slim-line desktop is approximately 3 inches.

Previous solutions for a slim-line desktop use a riser card to handle the height problem. The riser card plugs into the motherboard and has multiple slots with minimal slot spacing so that a slim-line desktop can be produced. However, an alternate planar designed to work with a riser card, known as NLX, is usually used to achieve the slim-line desktop. The use of the alternate planar for slim-line desktop creates problems such as two platforms, additional cost and inventory. Further, use of riser cards on the μATX planars still lack the ability to support multiple PCI adapter cards from a single PCI slot on the planar.

Accordingly, a need exists for a system and method for achieving support for multiple PCI adapter cards in a single PCI slot on an μATX planar. The present invention addresses such a need.

SUMMARY OF THE INVENTION

Multiple PCI adapter cards are supported by a single PCI slot through the aspects of the present invention. A computer system aspect includes an μATX planar including at least one PCI slot, and a riser card mounted in the at least one PCI slot, the riser card supporting multiple PCI adapter cards and providing signal generation to allow the multiple PCI adapter cards to utilize the at least one PCI slot. The riser card aspect includes a PCI connector for coupling to a PCI slot on the μATX planar, a plurality of PCI slots for attaching a plurality of PCI adapter cards, and a logic device for providing separate bus signal pairs to each of the plurality of PCI adapter cards from a single signal pair of the PCI slot on the μATX planar.

Through the present invention, expansion of an μATX planar to support multiple PCI adapter cards without altering the planar is achieved. Thus, while the standard planar may be utilized in tower system arrangements, the utilization of the riser card in accordance with the present invention allows the same planar to be used in a very small desktop package. These and other advantages of the aspects of the present invention will be more fully understood in conjunction with the following detailed description and accompanying drawings.

DETAILED DESCRIPTION

The present invention relates to μATX system planars and PCI adapter cards. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
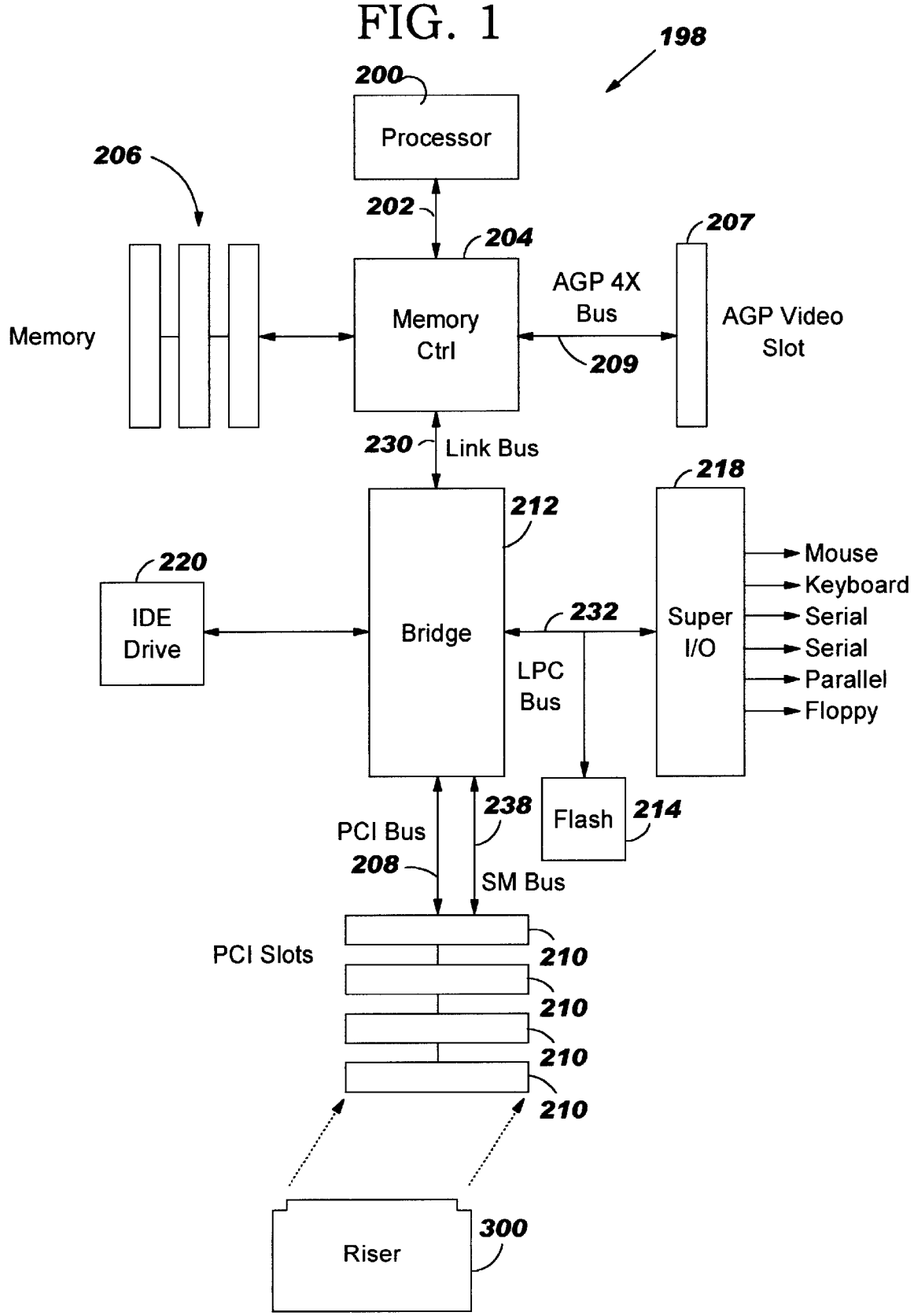
FIG. 1 illustrates a block diagram representation of a μATX computer system planar.

FIG. 1 depicts a pictorial representation of a computer system μATX planar 198 (also commonly called a motherboard or system board) which is mounted within a computer system and provides a means for mounting and electrically interconnecting various components of the system, including a central processing unit (CPU) 200, system memory 206, and accessory cards or boards as is well known in the art.

CPU 200 is connected by address, control, and data busses 202 to a memory controller 204 which is coupled to system memory 206. Memory controller 204 is further coupled to AGP (Advance Graphics Port) video slot 207 via an AGP 4× bus 209 for processing display data. Bridge controller 212 is connected to memory controller 204 via bus 230. An integrated drive electronics (IDE) device controller is integrated into bridge 212. Bridge controller 212 provides for the attachment of IDE compatible storage devices, such as a hard disk drive. PCI/ISA bridge 212 provides an interface to PCI bus 208.

An I/O controller 218 is coupled to bridge controller 212. I/O controller 218 controls communication between bridge controller 212 and devices and peripherals such as floppy drive, keyboard, and mouse, so that these devices may communicate with CPU 200. A system management bus (SM) 238 is included and is a two-wire, low-speed serial bus used to interconnect management and monitoring devices.

Bridge controller 212 connected to an interface for a flash memory 214 via Low Pin Count (LPC) bus 232. Flash memory 214 is an electrically erasable programmable read only memory (EEPROM) module and includes BIOS that is used to interface between the I/O devices and operating system.

A PCI standard expansion bus with connector slots 210 is coupled to bridge 212. PCI connector slots 210 may receive PCI bus compatible peripheral cards. In accordance with the present invention, a single PCI slot 210 supports multiple PCI adapter cards through the use of a riser card 300, as discussed with reference to FIGS. 2 and 3. In this way, a standard μATX planar can be expanded to support a plurality of PCI adapter cards while maintaining a size suitable for slim-line desktop systems.

Figure 2:
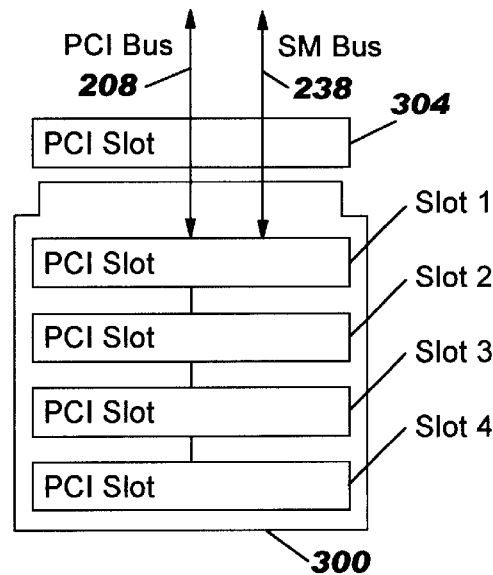
FIG. 2 illustrates a riser card with multiple PCI slots in accordance with the present invention.

FIG. 2 illustrates a riser card 300 that includes four PCI slots 302. As shown, the riser card 300 connects to a PCI slot 210 on the planar via a PCI connector 304. In a preferred embodiment, the riser card 300 has a height of approximately 2.8 inches and a length of approximately 5.2 inches, which allows successful utilization of the μATX planar and riser in slim-line desktop systems. While the use of riser cards in computer systems has been known, the present invention provides a unique solution for providing support for for multiple PCI adapter cards from one PCI slot. In addition to the benefits of system expandability, the present invention achieves the increase in PCI slots while maintaining a standard µATX planar layout.

Figure 3:
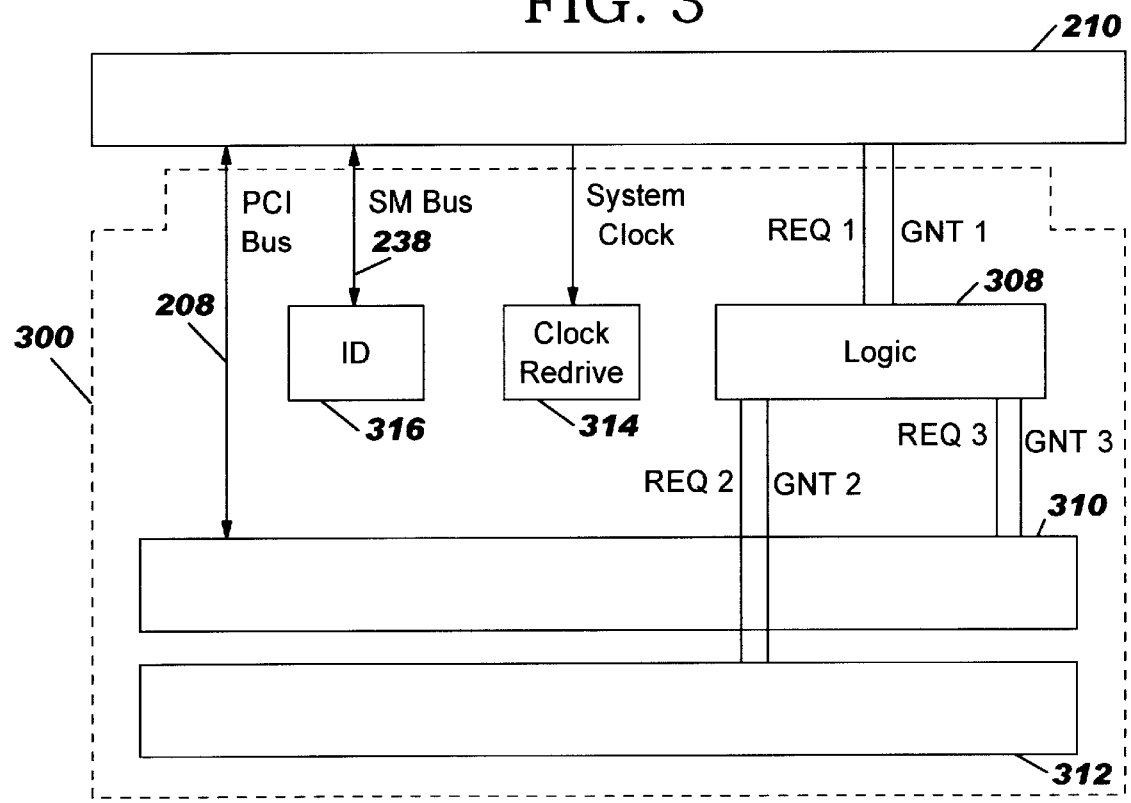
FIG. 3 illustrates a portion of the riser card of FIG. 2 in more detail.

In order to achieve the multiple PCI adapter card support, a single pair of PCI bus request/grant lines for a planar PCI slot 210 is utilized to provide multiple PCI bus request/grant pairs for the riser card 300. By way of example, FIG. 3 illustrates two PCI expansion slots 306 on riser card 300. A logic device, e.g., a programmable logic array, 308 converts a single pair of PCI bus grant/request signals from PCI slot 210 into separate pairs for adapter card PCI slots 310 and 312. The logic device 308 includes an internal register that tracks which slot, 310 or 312, is requesting the PCI bus (REQ2 or REQ3) and drives out the single PCI request line back (REQ1) to the system. The system receives the request and drives back to the slot 210 the PCI grant signal. The common PCI grant (GNT1) goes into the logic block 308. Using the internal register, the logic block 308 activates the correct grant signal (GNT2 or GNT3) to the correct slot, 310 or 312.

A clock redrive circuit 314 is also utilized on riser 300 to provide separate clock signals from the system clock signal for each adapter card slot 310 and 312 by well known clock redrive techniques. By way of example, clock redrive circuit CY2305 from Cypress Semiconductor is suitable. To determine if the PCI slot 210 contains an adapter card or a riser card 300, the SM bus 238 is utilized, as is standard for each PCI slot 210. It should be appreciated that the addition of SM bus to PCI bus is a proposed change to PCI spec 2.2. From the SM bus 238, a riser identifier is provided via an SM bus I/O device 316, such as Philips part 9556, to allow the planar to have a standard method for identifying various riser cards in the slots and to indicate to the system how many slots are provided on the riser 300.

With the successful signal generation through the use of the logic device on the riser card, multiple adapter cards may be utilized in a single planar PCI slot. No changes are required to the planar to achieve the expansion, while the planar's capability to be used in slim-line system designs is enhanced.

Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims

What is claimed is:

1. A computer system supporting multiple PCI (peripheral component interconnect) adapter cards from a single PCI slot, the computer system comprising:

an µATX planar including at least one PCI slot; and a riser card mounted in the at least one PCI slot, the riser card supporting multiple PCI adapter cards and providing signal generation to allow the multiple PCI adapter cards to utilize the at least one PCI slot.

2. The system of claim 1 wherein the riser card further comprises a riser identifier device for identifying the number of PCI adapter cards supported by the riser card.

3. A computer system supporting multiple PCI (peripheral component interconnect) adapter cards from a single PCI slot, the computer system comprising:

an µATX planar including at least one PCI slot; and a riser card mounted in the at least one PCI slot, the riser card supporting multiple PCI adapter cards and providing signal generation to allow the multiple PCI adapter cards to utilize the at least one PCI slot, the riser card further comprising a logic device for monitoring utilization of the at least one PCI slot among the multiple PCI adapter cards.

4. The system of claim 3 wherein the logic device further generates separate PCI bus request and grant signal pairs for each of the multiple PCI adapter cards based on a single pair of PCI bus request and grant signals of the at least one PCI slot.

5. A computer system supporting multiple PCI (peripheral component interconnect) adapter cards from a single PCI slot, the computer system comprising:

an µATX planar including at least one PCI slot; and a riser card mounted in the at least one PCI slot, the riser card supporting multiple PCI adapter cards and providing signal generation to allow the multiple PCI adapter cards to utilize the at least one PCI slot, the riser card further comprising a clock redrive circuit for providing separate clock signals to each of the multiple adapter cards.

6. A computer system supporting multiple PCI (peripheral component interconnect) adapter cards from a single PCI slot, the computer system comprising:

an µATX planar including at least one PCI slot; and a riser card mounted in the at least one PCI slot, the riser card supporting multiple PCI adapter cards and providing signal generation to allow the multiple PCI adapter cards to utilize the at least one PCI slot, wherein the riser card is less than about three inches in height.

7. A method for supporting multiple PCI adapter cards in a single PCI slot in a computer system, the method comprising:

providing a riser card for multiple PCI adapter cards in a PCI slot of an µATX planar;

supporting individual signaling for the multiple PCI adapter cards based on at least a pair of bus signals of the PCI slot, including providing separate clock signals to each of the multiple PCI adapter cards; and utilizing the multiple PCI adapter cards through the PCI slot.

8. The method of claim 7 wherein a clock redrive circuit drives the separate clock signals to each of the plurality of multiple PCI adapter cards.

9. A method for supporting multiple PCI adapter cards in a single PCI slot in a computer system, the method comprising:

providing a riser card for multiple PCI adapter cards in a PCI slot of an µATX planar, supporting individual signaling for the multiple PCI adapter cards based on at least a pair of bus signals of the PCI slot, including translating a bus request/grant signal pair of the PCI slot into separate pairs of bus request/grant signals for each of the multiple PCI adapter cards; and utilizing the multiple PCI adapter cards through the PCI slot.

10. The method of claim 9 wherein a logic device performs the translation.

11. A riser card for supporting multiple PCI adapter cards on an µATX planar of a computer system, the riser card comprising:

a PCI connector for coupling to a PCI slot on the µATX planar;

a plurality of PCI slots for attaching a plurality of PCI adapter cards; and a logic device for providing separate bus signal pairs to each of the plurality of PCI adapter cards from a single signal pair of the PCI slot on the µATX planar.

12. The riser card of claim 11 wherein the plurality of PCI slots further comprise up to four slots.

13. The riser card of claim 11 further comprising an identifier device for identifying the number of PCI slots on the riser card.

14. A riser card for supporting multiple PCI adapter cards on an µATX planar of a computer system, the riser card comprising:

a PCI connector for coupling to a PCI slot on the µATX planar;

a plurality of PCI slots for attaching a plurality of PCI adapter cards; and a logic device for providing separate bus signal pairs to each of the plurality of PCI adapter cards from a single signal pair of the PCI slot on the µATX planar, wherein the bus signal pairs further comprise bus request and grant signal pairs.

15. A riser card for supporting multiple PCI adapter cards on an µATX planar of a computer system, the riser card comprising:

a PCI connector for coupling to a PCI slot on the µATX planar;

a plurality of PCI slots for attaching a plurality of PCI adapter cards; and a logic device for providing separate bus signal pairs to each of the plurality of PCI adapter cards from a single signal pair of the PCI slot on the µATX planar, wherein the riser card further comprises a card with a height of less than about three inches.

16. A riser card for supporting multiple PCI adapter cards on an µATX planar of a computer system, the riser card comprising:

a PCI connector for coupling to a PCI slot on the µATX planar;

a plurality of PCI slots for attaching a plurality of PCI adapter cards;

a logic device for providing separate bus signal pairs to each of the plurality of PCI adapter cards from a single signal pair of the PCI slot on the µATX planar; and a clock redrive circuit for providing separate clock signals to each of the plurality of PCI adapter cards.

* * * * *